(12) United States Patent
Teng et al.

(10) Patent No.: US 7,189,649 B2
(45) Date of Patent: Mar. 13, 2007

(54) METHOD OF FORMING A MATERIAL FILM

(75) Inventors: Hsien-Che Teng, Tai-Nan (TW); Chin-Fu Lin, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 258 days.

(21) Appl. No.: 10/711,067

(22) Filed: Aug. 20, 2004

(65) Prior Publication Data
US 2006/0040496 A1   Feb. 23, 2006

(51) Int. Cl.
*H01L 21/44* (2006.01)

(52) U.S. Cl. .................................... 438/685

(58) Field of Classification Search ............... 438/685, 438/656, 648, 683
See application file for complete search history.

(56) References Cited

U.S. PATENT DOCUMENTS 6,951,804 B2 * 10/2005 Seutter et al. .............. 438/618

* cited by examiner

*Primary Examiner*—M. Wilczewski
*Assistant Examiner*—Seth Barnes
(74) *Attorney, Agent, or Firm*—Winston Hsu

(57) ABSTRACT

A method of forming a material film is provided. A chemical vapor deposition (CVD) chamber including therein a showerhead coupled to a gas source and a pedestal coupled to a heater is provided. The showerhead is coupled to a radio frequency (RF) power source. A substrate is positioned on the pedestal. The substrate is then heated by the heater. A tantalum-containing organic metal precursor gas is flowed into the CVD chamber through the showerhead with the RF power source being off, thereby depositing a material film on the heated substrate. Thereafter the RF power source is turned on to output a RF power. An inert gas is flowed into the chamber. The material film in-situ plasma treated within the CVD chamber by providing the RF power to the inert gas. The substrate is removed out of the CVD chamber.

24 Claims, 2 Drawing Sheets

METHOD OF FORMING A MATERIAL FILM

BACKGROUND OF INVENTION

1. Field of the Invention

The present invention relates to the filed of semiconductor processes and, more particularly, to a method of tantalum/tantalum nitride (Ta/TaN) deposition.

2. Description of the Prior Art

In the manufacture of silicon semiconductor devices, layers of barrier material are deposited to separate interconnecting metal from silicon and prevent their diffusion. As well known in the art, transition metal nitrides such as titanium nitride are widely used and examined as barrier materials in ultra-large scale integration of microelectronic devices between copper or aluminum and silicon.

Titanium nitride TiN has been the most studied barrier material and is used in production at current integration scale. However, titanium nitride has several limitations and will probably not meet future demanding requirements for device integrity, (i.e. device failure due to copper diffusion).

Tantalum nitride TaN has recently received extensive interest as a barrier material. Tantalum nitride provides superior physical properties with respect to titanium nitride. It has a high melting point, is very hard, highly conductive, and thermodynamically very stable with respect to Cu because it does not form copper-tantalum or copper-nitride compounds. As compared to TiN, the grain boundaries of TaN are often disordered while CVD-deposited TiN films typically exhibit a columnar grain structure. Due to this disordered grain boundary structure, TaN may prevent copper diffusion more efficiently than TiN.

Typical techniques used for deposition of TaN layers include physical vapor deposition (PVD), chemical vapor deposition (CVD) and atomic layer deposition (ALD). Reactive sputtering is the oldest technique, and it has been the main process for depositing tantalum nitride films. Sputtered films are usually quite free from impurities and have low resistivity, but the step coverage is poor.

Chemical vapor deposition (CVD) methods are a main technique currently used for deposition of TaN layers for different applications. The films made by CVD exhibit much better conformity than the films deposited by PVD methods. Conventional CVD processes, which rely on metal halides, required high temperature (for example, deposition of tantalum nitride from $TaCl_5$ required 900° C.). This problem has been solved by using MOCVD precursors and low temperature plasma enhanced chemical vapor deposition (PECVD).The other variant of deposition process, atomic layer deposition (ALD) and its several enhancements, allows very good control of layer thickness and uniformity, provides a good step coverage, and relatively low deposition temperature. However, current approaches for forming TaN layers have low throughput and relatively high cost.

There is a constant need in this industry to provide a method of forming a TaN layer as barrier material in the fabrication of integrated circuits that is cost effective and has high throughput.

SUMMARY OF INVENTION

Accordingly, the primary object of the present invention is to provide an inexpensive method of depositing a material film as barrier material in the fabrication of integrated circuits with high throughput.

It is another object of the present invention to provide a method of forming a Ta/TaN barrier on a substrate comprising a step of in-situ plasma treating the tantalum nitride film.

According to the claimed invention, a method of forming a material film is provided. A chemical vapor deposition (CVD) chamber comprising therein a showerhead coupled to a gas source and a pedestal coupled to a heater is provided. The showerhead is coupled to a radio frequency (RF) power source. A substrate is then positioned on the pedestal. The substrate is heated by the heater. A tantalum-containing organic metal precursor gas is flowed into the CVD chamber through the showerhead with the RF power source being off, thereby depositing a material film on the heated substrate. Thereafter the RF power source is turned on to output a RF power. An inert gas is flowed into the chamber. The material film in-situ plasma treated within the CVD chamber by providing the RF power to the inert gas. The substrate is removed out of the CVD chamber.

From one aspect of the present invention, a method of forming a tantalum nitride film is provided. A chemical vapor deposition (CVD) chamber comprising at least therein a showerhead coupled to a gas source and a pedestal coupled to a heater is prepared. The showerhead is further coupled to a first radio frequency (RF) power source. A substrate is then positioned on the pedestal.

The substrate is heated by the heater. A nitrogen-containing gas is flowed into the CVD chamber for a preselected time period. The flow of the nitrogen-containing gas is then shut down. The CVD chamber is purged with inert gas.

After purging the CVD chamber, a tantalum-containing organic metal precursor gas is flowed into the CVD chamber through the showerhead with the first radio frequency (RF) power source being off, thereby depositing a tantalum nitride film on the heated substrate. Thereafter the first RF power source is turned on to output a first RF power. An inert gas is then flowed into the chamber. The tantalum nitride film is in-situ plasma treated within the CVD chamber by providing the first RF power to the inert gas. The substrate is removed out of the CVD chamber.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a method for depositing and treating a material film on a substrate within the same process chamber. According to one preferred embodiment of this invention, the material film is a TaN film and is formed by reacting tantalum containing metal-organic precursor with a nitrogen source. In a preferred case, the deposition of the tantalum nitride (TaN) film is performed in a surface-controlled layer-by-layer manner, i.e., atomic layer deposition or ALD process, with atomic accuracy. It is to be understood that CVD TaN films may be formed by thermally decomposing such tantalum containing metal-organic precursor. Further, the material film may be a tantalum (Ta) film.

Figure 1:
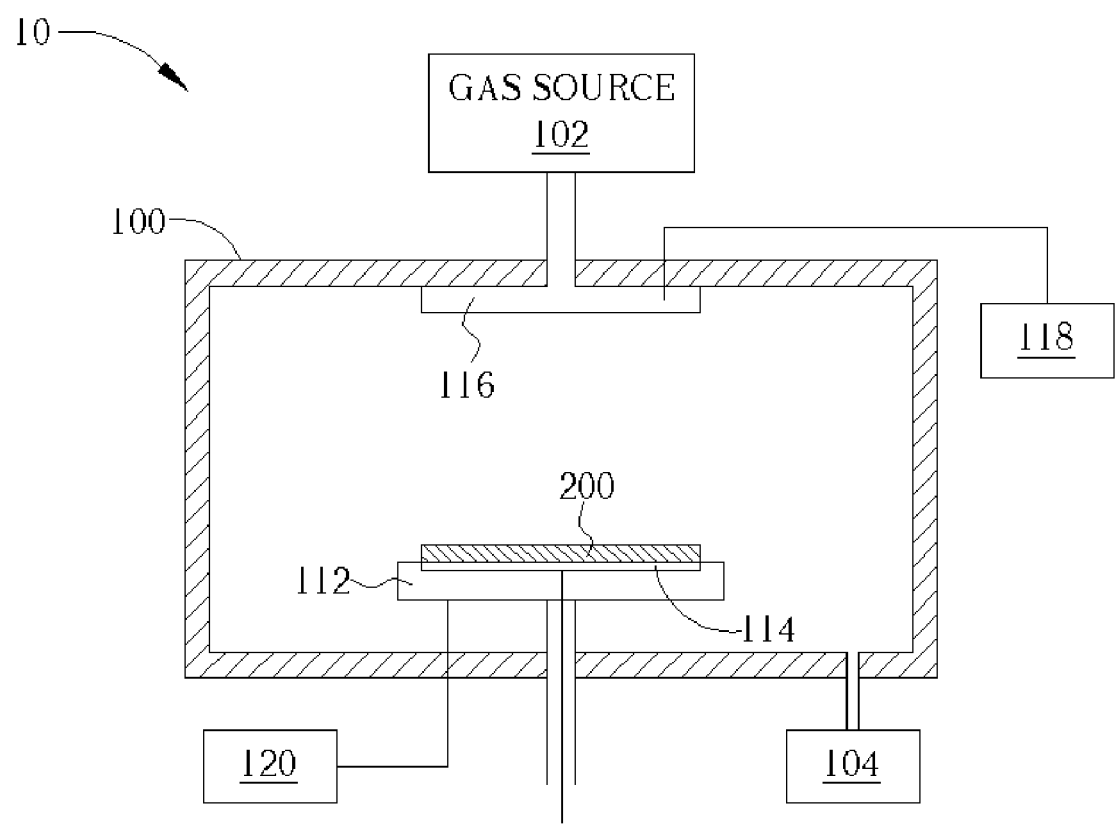
FIG. 1 depicts a schematic diagram of a wafer processing system that can be used to perform TaN film deposition in accordance with the preferred embodiment of this invention.

Please refer to FIG. 1. FIG. 1 is a schematic representation of a wafer processing system 10 that can be used to perform TaN film deposition in accordance with the preferred embodiment of this invention. The wafer processing system 10 comprises a CVD process chamber 100, a gas source 102 and a vacuum pump 104.

The CVD process chamber 100 houses a support pedestal 112, which is used to support a substrate 200 such as a semiconductor wafer. The substrate 200 can be heated to a desired temperature by an embedded heater element 114. Typically, a temperature sensor, such as a thermal couple, may be installed in the support pedestal 112 to monitor the temperature of the support pedestal 112 and the substrate 200.

A showerhead 116, through which process gases are introduced into the chamber 100, is located above the support pedestal 112. The showerhead 116 is coupled to gas source 102 that can be controlled by a computer control unit (not shown). The gas source 102 is capable of providing tantalum containing metal-organic precursors, nitrogen source gases, carrier gases, inert gases such as argon, and the like, to the chamber 100.

According to the preferred embodiment of this invention, the showerhead 116 is connected to a radio frequency (RF) power source 118. According to another preferred embodiment of this invention, the support pedestal 112 is optionally coupled to a RF power source 120.

Figure 2:
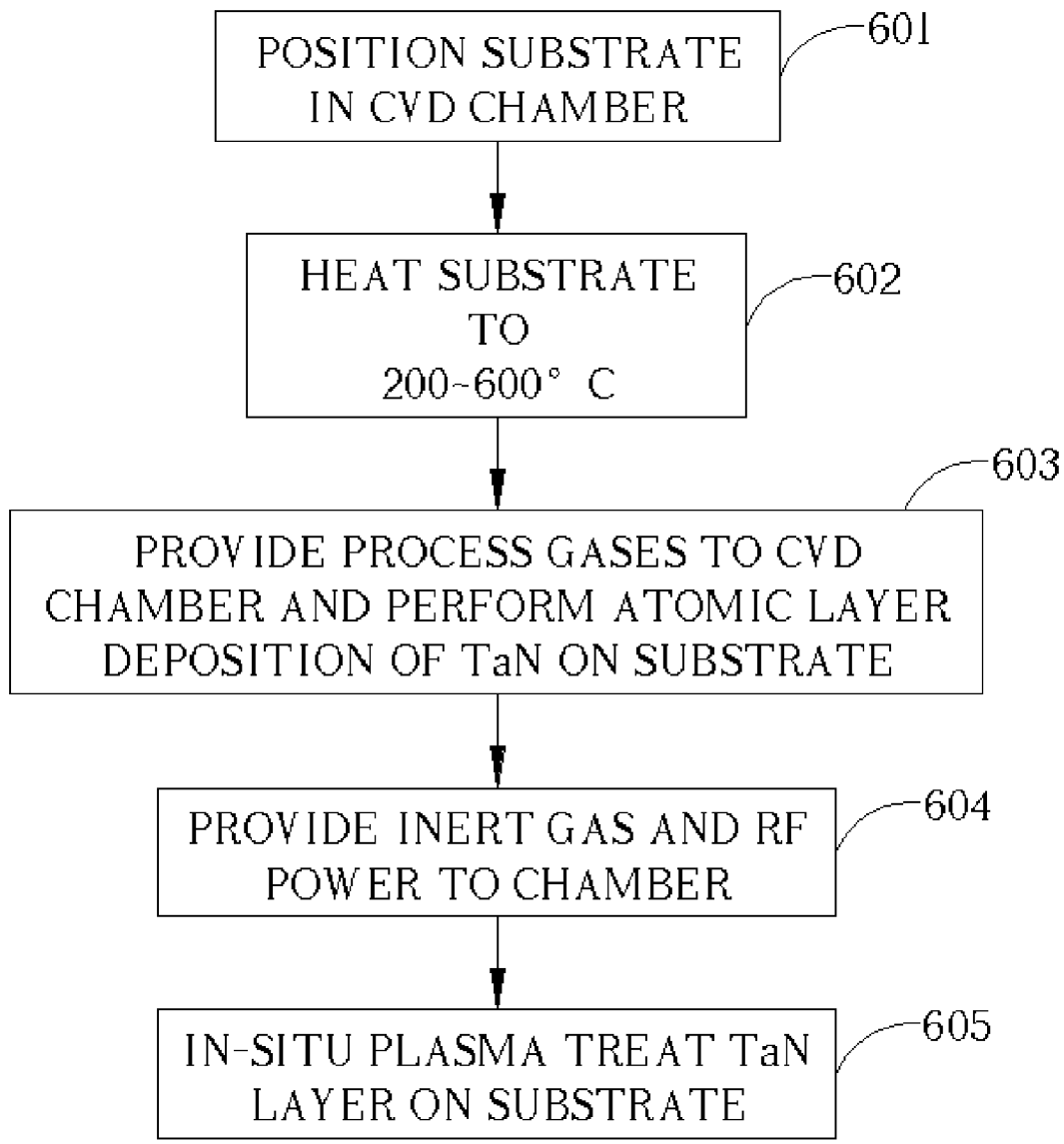
FIG. 2 depicts a process flow diagram in which a preferred process sequence is executed for depositing a material layer using the method described therein.

Please refer to FIG. 2, and briefly back to FIG. 1. FIG. 2 depicts a process flow diagram in which a preferred process sequence is executed for depositing a material layer using the method in accordance with the present invention. In Step 601, the substrate (or wafer) 200 is positioned on the support pedestal 112 within the CVD chamber 100. It is to be understood that the CVD chamber 100 may be one process chamber of a multi-chamber cluster tool. Moreover, the substrate 200 may be degassed or pre-cleaned in respective process chambers of the aforesaid cluster tool prior to Step 601. In Step 602, the substrate 200 is heated to a temperature of about 200~600° C., more preferably 200~300° C. by the heater element 114.

In accordance with the preferred embodiment of this invention, in Step 603, the first cycle, a nitrogen-containing gas, such as ammonia ($NH_3$), is flowed into the CVD chamber 100 at a flow rate of 300~4000 sccm for a preselected time period, for example, 1 second to 5 seconds. The nitrogen-containing gas is transported to the surface of the substrate 200 and is saturatively chemisorbed at the surface. The flow of the nitrogen-containing gas is then shut down. The CVD chamber is purged with inert gas such as argon for a time period of, for example, 0.5 seconds.

After purging the CVD chamber, in the next reaction cycle, a tantalum-containing organic metal precursor gas is introduced into the CVD chamber 100 through the showerhead 116 with the first radio frequency (RF) power source being off, thereby depositing a tantalum nitride film on the heated substrate 200. During this reaction cycle, the tantalum-containing organic metal precursor reacts with ammonia molecules that are previously absorbed by the substrate surface. The thickness of the film can be controlled in a straightforward manner by controlling the number of reaction cycles, therefore enabling the controlled growth of ultra thin layers. The precursors are saturatively chemisorbed, thus bringing stoichiometric films with large area uniformity and conformality even on complex surfaces with deformities.

The tantalum-containing organic metal precursor may be pentakis(dimethylamido) tantalum (PDMAT) (Ta(N(Me)$_2$)$_5$) or pentakis(diethylamido) tantalum (PDEAT) (Ta(N(Et)$_2$)$_5$), among others. Carrier gases such as argon (Ar) may be mixed with the tantalum-containing organic metal precursor.

After depositing the TaN film to a desired thickness, the introduction of aforesaid process gases is terminated. Next, in Step 604, inert gas such as argon is introduced. In Step 605, the TaN film deposited on the substrate 200 is in-situ plasma treated by providing argon gas to the chamber and providing RF power to the argon gas. Preferably, the RF power generated by the RF power source 118 is between 50~1000 Watts. Under this condition, argon-based plasma is ignited by the electric field between the showerhead 116 and the support pedestal 112. In-situ plasma treatment of the TaN film is the salient part of the present invention. It saves wafer process time and thus improves throughput.

Depending on the specific requirements of the processes, the RF power source 120 may be turned on to provide a bias power to the argon-based plasma that is used to treat the TaN film. The use of RF power source 120 can result in more drastic bombardment on the surface of the TaN film. It is noted that the use of the RF power provided by RF power source 120 is optional and is in a range of between 0~1000 Watts.

According to one aspect of this invention, after forming the TaN film, the substrate 200 is removed out of the chamber 100. The substrate 200 is then positioned in a PVD chamber to go through a tantalum sputtering process, thereby forming a Ta/TaN compound barrier on the substrate. Typically, the Ta/TaN compound barrier may be formed on the surfaces of damascened trench and/or vias features (not shown) on the substrate 200. A conductive layer is then deposited on the Ta/TaN compound barrier, followed by chemical mechanical polishing (CMP).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a material film, comprising:
providing a chemical vapor deposition (CVD) chamber comprising therein a showerhead coupled to a gas source and a pedestal coupled to a heater, wherein said showerhead is further coupled to a radio frequency (RF) power source;
positioning a substrate on said pedestal;
heating said substrate by said heater;
flowing a nitrogen-containing gas into said CVD chamber, said nitrogen-containing gas being transported to a substrate surface of said substrate and saturatively chemisorbed onto said substrate surface;
shutting down said flow of said nitrogen-containing gas;
flowing a tantalum-containing organic metal precursor gas into said CVD chamber through said showerhead with said RF power source being off, wherein said tantalum-containing organic metal precursor gas reacts with said nitrogen-containing gas that are previously absorbed by said substrate surface; thereby depositing a material film on said heated substrate;

thereafter turning on said RF power source to output a RF power;

flowing an inert gas into said chamber;

in-situ plasma treating said material film within said CVD chamber by providing said RF power to said inert gas; and removing said substrate out of said CVD chamber.

2. The method of forming a material film according to claim 1 wherein said substrate is heated to a temperature of 200~600° C. by said heater.

3. The method of forming a material film according to claim 1 wherein said substrate is heated to a temperature of 200~300° C. by said heater.

4. The method of forming a material film according to claim 1 wherein said tantalum-containing organic metal precursor comprises pentakis(dimethylamido) tantalum (PDMAT) (Ta(N(Me)$_2$)$_5$) and pentakis(diethylamido) tantalum (PDEAT) (Ta(N(Et)$_2$)$_5$).

5. The method of forming a material film according to claim 1 wherein said inert gas comprises argon (Ar).

6. The method of forming a material film according to claim 1 wherein the step of in-situ plasma treating said material film uses argon plasma.

7. The method of forming a material film according to claim 1 wherein said RF power is between 50~1000 Watts.

8. The method of forming a material film according to claim 1 wherein said CVD chamber is further coupled to a vacuum pump.

9. The method of forming a material film according to claim 1 wherein said material layer is tantalum nitride layer.

10. The method of forming a material film according to claim 1 wherein said material layer is tantalum layer.

11. A method of forming a tantalum nitride film, comprising:

providing a chemical vapor deposition (CVD) chamber comprising at least therein a showerhead coupled to a gas source and a pedestal coupled to a heater, wherein said showerhead is further coupled to a first radio frequency (RF) power source;

positioning a substrate on said pedestal;

heating said substrate by said heater;

flowing a nitrogen-containing gas into said CVD chamber, said nitrogen-containing gas being transported to a substrate surface of said substrate and saturatively chemisorbed onto said substrate surface;

shutting down said flow of said nitrogen-containing gas;

purging said CVD chamber with inert gas;

thereafter flowing a tantalum-containing organic metal precursor gas into said CVD chamber through said showerhead with said first radio frequency (RF) power source being off, wherein said tantalum-containing organic metal precursor gas reacts with said nitrogen-containing gas that are previously absorbed by said substrate surface; thereby depositing a tantalum nitride film on said heated substrate;

thereafter turning on said first RF power source to output a first RF power;

flowing an inert gas into said chamber;

in-situ plasma treating said tantalum nitride film within said CVD chamber by providing said first RF power to said inert gas; and removing said substrate out of said CVD chamber.

12. The method of forming a tantalum nitride film according to claim 11 wherein said substrate is heated to a temperature of 200~600° C. by said heater.

13. The method of forming a tantalum nitride film according to claim 11 wherein said substrate is heated to a temperature of 200~300° C. by said heater.

14. The method of forming a tantalum nitride film according to claim 11 wherein said tantalum-containing organic metal precursor comprises pentakis(dimethylamido) tantalum (PDMAT) (Ta(N(Me)$_2$)$_5$) and pentakis(diethylamido) tantalum (PDEAT) (Ta(N(Et)$_2$)$_5$).

15. The method of forming a tantalum nitride film according to claim 11 wherein said pedestal is further coupled to a second RF power source.

16. The method of forming a tantalum nitride film according to claim 15 wherein said second RF power source outputs a second RF power of 0~1000 Watts.

17. The method of forming a tantalum nitride film according to claim 15 wherein said second RF power source is off during said deposition of said tantalum nitride film.

18. The method of forming a tantalum nitride film according to claim 11 wherein said inert gas comprises argon (Ar).

19. The method of forming a tantalum nitride film according to claim 11 wherein the step of in-situ plasma treating said tantalum nitride film uses argon plasma.

20. The method of forming a tantalum nitride film according to claim 11 wherein said first RF power is between 50~1000 Watts.

21. The method of forming a tantalum nitride film according to claim 11 wherein said CVD chamber is further coupled to a vacuum pump.

22. The method of forming a tantalum nitride film according to claim 11 wherein said nitrogen-containing gas is ammonia gas.

23. The method of forming a material film according to claim 1 wherein said inert gas, said nitrogen-containing gas and said tantalum-containing organic metal precursor gas are flowed into said CVD chamber through said showerhead.

24. The method of forming a material film according to claim 11 wherein said inert gas, said nitrogen-containing gas and said tantalum-containing organic metal precursor gas are flowed into said CVD chamber through said showerhead.

* * * * *